(12) United States Patent
de Lyon et al.

(10) Patent No.: US 9,923,114 B2
(45) Date of Patent: Mar. 20, 2018

(54) INFRARED DETECTOR AND METHOD OF DETECTING ONE OR MORE BANDS OF INFRARED RADIATION

(71) Applicant: The Boeing Company, Huntington Beach, CA (US)

(72) Inventors: Terence J. de Lyon, Newbury Park, CA (US); Sevag Terterian, Lake Balboa, CA (US); Hasan Sharifi, Agoura Hills, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/955,265

(22) Filed: Dec. 1, 2015

(65) Prior Publication Data

US 2017/0155010 A1    Jun. 1, 2017

(51) Int. Cl.
*H01L 31/109*    (2006.01)
*H01L 31/0304*    (2006.01)
*H01L 27/146*    (2006.01)

(52) U.S. Cl.
CPC ...... *H01L 31/109* (2013.01); *H01L 27/14649* (2013.01); *H01L 31/03042* (2013.01); *H01L 31/03046* (2013.01)

(58) Field of Classification Search
None
See application file for complete search history.

(56) References Cited

U.S. PATENT DOCUMENTS

| | | | |
|---|---|---|---|
| 7,687,871 B2 | 3/2010 | Maimon | |
| 7,795,640 B2 | 9/2010 | Klipstein | |
| 2010/0072514 A1* | 3/2010 | Ting | H01L 31/0304 257/184 |

* cited by examiner

*Primary Examiner* — Edwin Gunberg
(74) *Attorney, Agent, or Firm* — Armstrong Teasdale LLP

(57) ABSTRACT

An infrared detector is provided. The infrared detector includes an absorption layer sensitive to radiation in only a short wavelength infrared spectral band, and a barrier layer coupled to the absorption layer. The barrier layer is fabricated from an alloy including aluminum and antimony, and at least one of gallium or arsenic, and the composition of the alloy is selected such that valence bands of the absorption layer and the barrier layer substantially align.

17 Claims, 3 Drawing Sheets

INFRARED DETECTOR AND METHOD OF DETECTING ONE OR MORE BANDS OF INFRARED RADIATION

BACKGROUND

The field of the present disclosure relates generally to semiconductor technology and, more specifically, to an infrared detector that includes a barrier layer that may be used concurrently with absorption layers sensitive to radiation in different infrared spectral bands.

At least some known infrared detectors include a barrier layer that is coupled to an absorption layer that generates an electrical current after receiving infrared radiation in a predetermined wavelength band. In such detectors, the barrier layer is fabricated from a uniform material that is aligned with valence band energy levels of the absorption layer. Accordingly, the uniform barrier layer is generally not suitable for concurrent use with a second absorption layer that is sensitive to a different wavelength band if the valence band edge of the second absorption layer is not naturally aligned with that of the first absorption layer.

The response of an infrared detector is a function of an operating bias voltage that is applied to the device structure. Misalignments in valence band energy levels of a barrier layer and an absorption layer can be remedied, to an extent, by adjusting a magnitude of a bias voltage applied to the device structure. However, applying a bias voltage greater than about 500 millivolts (mV) may create an increase in dark current that reduces performance of the detector and reduces the ability of the infrared detector to accurately detect infrared radiation. Moreover, detector biases greater than about 500 mV often cannot be supplied by the internal bias circuitry within silicon-based readout integrated circuits. As such the use of infrared detectors may be limited.

Achieving proper alignment of the valence band energy levels of barrier layers and multiple absorbing layers in a detector structure designed for detection of infrared radiation in multiple spectral bands is highly desirable.

BRIEF DESCRIPTION

In one aspect, an infrared detector is provided. The infrared detector includes an absorption layer sensitive to radiation in only a short wavelength infrared spectral band, and a barrier layer coupled to the absorption layer. The barrier layer is fabricated from an alloy including aluminum and antimony, and at least one of gallium or arsenic, and the composition of the alloy is selected such that valence bands of the absorption layer and the barrier layer substantially align.

In another aspect, an imaging system is provided. The imaging system includes a readout integrated circuit, and an infrared detector electrically coupled to the readout integrated circuit. The infrared detector includes an absorption layer sensitive to radiation in only a short wavelength infrared spectral band, and a barrier layer coupled to the absorption layer. The barrier layer is fabricated from an alloy including aluminum and antimony, and at least one of gallium or arsenic, and the composition of the alloy is selected such that valence bands of the absorption layer and the barrier layer substantially align. The readout integrated circuit is configured to apply a bias voltage to the infrared detector.

In yet another aspect, a method of detecting infrared radiation is provided. The method includes applying a bias voltage to a single-band infrared detector including an absorption layer sensitive to radiation in only a short wavelength infrared spectral band, and a barrier layer coupled to the absorption layer. The barrier layer is fabricated from an alloy including aluminum and antimony, and at least one of gallium or arsenic, and the composition of the alloy is selected such that valence bands of the absorption layer and the barrier layer substantially align. The method also includes receiving an electrical signal from the single-band infrared detector when the bias voltage is applied thereto, wherein the electrical signal corresponds to detection of radiation in the short wavelength infrared spectral band.

DETAILED DESCRIPTION

The implementations described herein relate to either a single-band or a dual-band infrared detector formed from semiconductor materials. The semiconductor materials provide a unique alloy for forming a barrier layer in the infrared detectors. The semiconductor materials include aluminum and antimony, and at least one of gallium or arsenic, thereby defining either a ternary or quaternary alloy for use as the barrier layer in the infrared detectors. For example, conventional $Al_{0.93}Ga_{0.07}Sb$ alloys are typically used in conjunction with absorbers capable of detecting radiation in the medium wavelength infrared spectral band. However, when used in conjunction with absorbers capable of detecting radiation in the short wavelength infrared spectral band, the alloy creates a barrier to the collection of photo-generated holes in the photodetector. As such, the composition of the alloy to be used in the infrared detectors described herein is selected to ensure the alloy is compatible with absorbers capable of detecting radiation in both the medium and short wavelength infrared spectral bands. More specifically, the alloy forms an alternative wide-bandgap barrier layer whose valence band substantially aligns with both the medium and short wavelength infrared absorbers. Moreover, the barrier layer does not need to be lattice matched with the absorber layers, thereby allowing the composition of the barrier layer to be modified in a manner that ensures the infrared detectors described herein have acceptable dark current performance and activate at a near 0 volt bias, for example.

Figure 1:
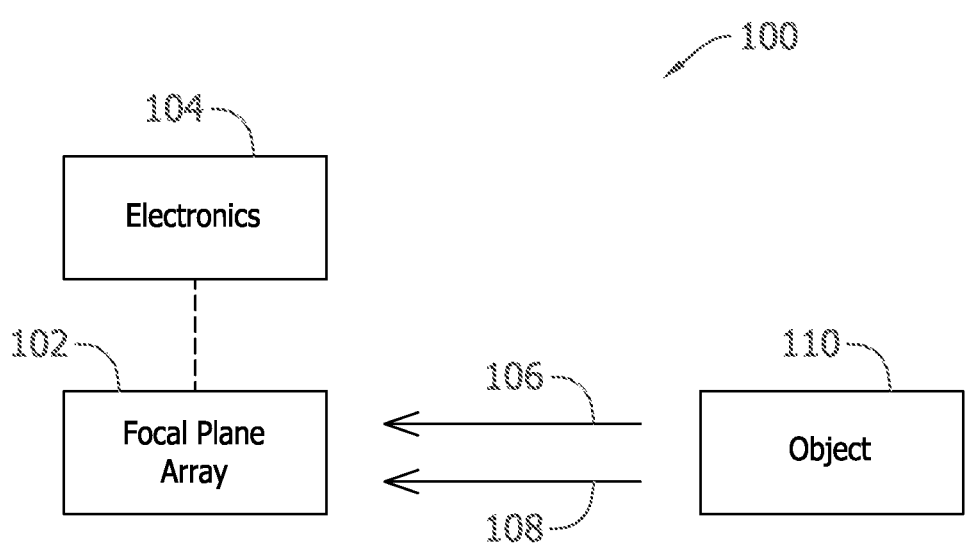
FIG. 1 is a block diagram of an exemplary environment in which an infrared detector may be used.

FIG. 1 is a block diagram of an exemplary environment 100 in which a focal plane array 102 may be used. In the exemplary implementation, focal plane array 102 is coupled in communication with electronics 104, and is capable of detecting a first infrared radiation 106 and a second infrared radiation 108 emitted from an object 110. First infrared radiation 106 is emitted from object 110 in a first infrared spectral band, and second infrared radiation 108 is emitted from object 110 in a second infrared spectral band different than the first infrared spectral band. More specifically, in one implementation, the first infrared spectral band corresponds to short wavelength infrared radiation (SWIR), having wavelengths within a range defined between about 1 micrometer and about 2.5 micrometers, and the second spectral band corresponds to medium wavelength infrared radiation (MWIR), having wavelengths within a range between about 3.0 and about 5 micrometers. In some implementations, at least one of the first infrared spectral band and the second infrared spectral band corresponds to less than a full range of the SWIR or MWIR wavelengths and/or spans one or more of SWIR and MWIR wavelength ranges. Additionally, in some implementations, the first infrared spectral band partially overlaps with the second infrared spectral band.

As described above, focal plane array 102 is coupled in communication with electronics 104, which enables focal plane array 102 to transmit infrared detection data to electronics 104, or enables electronics 104 to transmit instructions to focal plane array 102. Moreover, electronics 104 performs one or more functions to facilitate processing of infrared detection data, such as image processing, for example filtering and/or object recognition, and other functions such as storage and/or transmission of data to one or more additional computing devices (not shown).

In one implementation, and as will be described in more detail below, electronics 104 includes one or more components having functionality that enables focal plane array 102 to selectively detect radiation in at least one of the first and second infrared spectral bands. More specifically, focal plane array 102 facilitates converting infrared radiation to electrical signals for further processing and/or storage, and electronics 104 facilitates processing the electrical signals.

Figure 2:
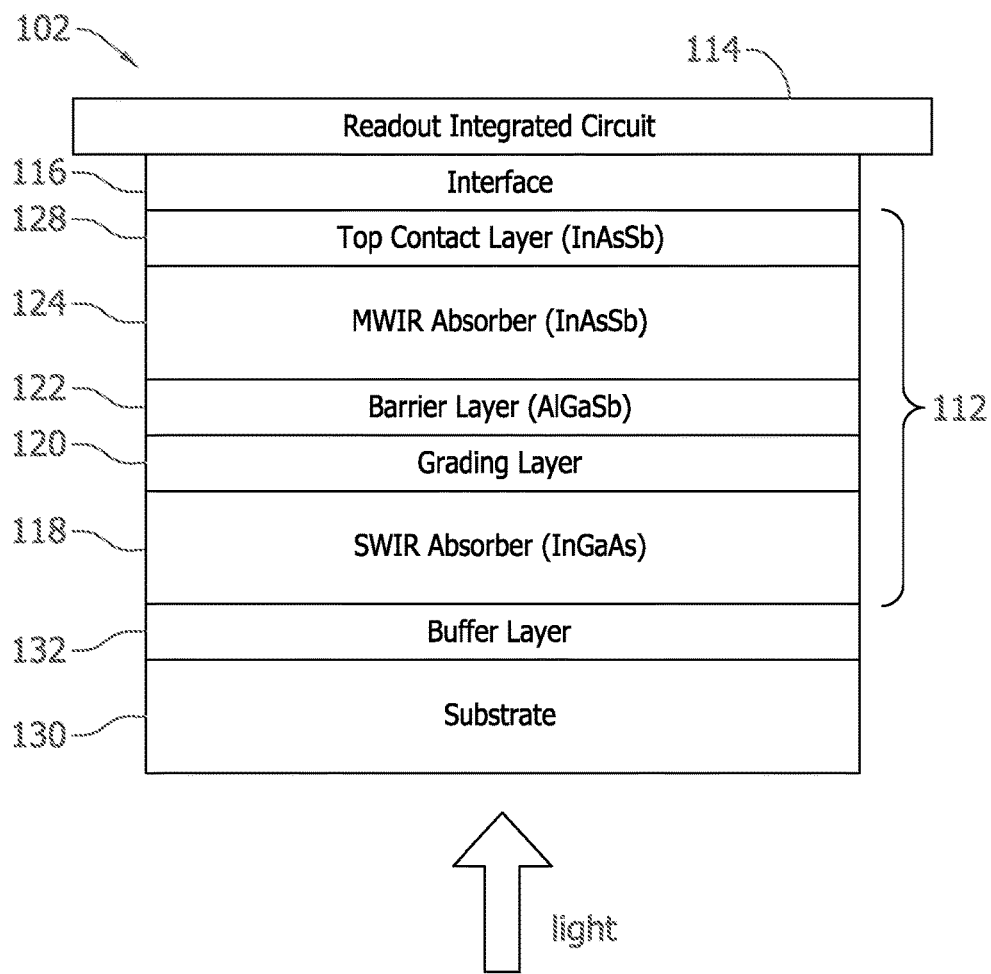
FIG. 2 is a schematic illustration of a dual-band infrared detector that may be used with the focal plane array shown in FIG. 1.

FIG. 2 is a schematic illustration of a dual-band infrared detector 112 that may be used with focal plane array 102. In the exemplary implementation, dual-band infrared detector 112 is electrically coupled to a readout integrated circuit 114 via an interface 116. Dual-band infrared detector 112 includes a first absorption layer 118 sensitive to radiation in only a short wavelength infrared spectral band, at least one grading layer 120 coupled to first absorption layer 118, at least one barrier layer 122 coupled to grading layer 120, and a second absorption layer 124 coupled to barrier layer 122 opposite first absorption layer 118. Second absorption layer 124 is sensitive to radiation in only a medium wavelength infrared spectral band.

First absorption layer 118 may be formed from any material that enables dual-band infrared detector 112 to function as described herein. In the exemplary implementation, first absorption layer 118 is sensitive to wavelengths defined within a range between about 1 micrometer and about 2.5 micrometers, and is formed from an alloy including indium, gallium, and arsenic. Alternatively, first absorption layer 118 is sensitive to wavelengths of up to about 4.5 micrometers. Moreover, second absorption layer 124 may be formed from any material that enables dual-band infrared detector 112 to function as described herein. In the exemplary implementation, second absorption layer 124 is sensitive to wavelengths within a range between about 3.0 micrometers and about 5 micrometers, and is formed from an alloy including indium, arsenic, and antimony. Alternatively, second absorption layer 124 is sensitive to wavelengths of up to about 8.0 micrometers.

In the exemplary implementation, barrier layer 122 is formed from an alloy that is compatible with both first and second absorption layers 118 and 124. More specifically, barrier layer 122 is fabricated from an alloy including aluminum and antimony, and at least one of gallium or arsenic. Typically, such alloys are used in conjunction with MWIR absorbers, and a different alloy is used in conjunction with SWIR absorbers. However, the composition of the alloy used to fabricate barrier layer 122 is selected such that valence bands of barrier layer 122 and first and second absorption layers 118 and 124 substantially align. Put another way, the composition of the alloy used to fabricate barrier layer 122 is selected such that the valence band offsets between barrier layer 122 and first and second absorption layers 118 and 124 are less than a predetermined threshold.

Moreover, the alloy used to fabricate barrier layer 122 is generally lattice mismatched with SWIR absorbers fabricated from indium, gallium, and arsenic. As such, first absorption layer 118 and barrier layer 122 are formed from materials having a lattice parameter mismatch greater than a predetermined threshold. For example, the lattice parameter mismatch between first absorption layer 118 and barrier layer 122 is greater than about 2.5 percent. As such, the composition of barrier layer 122 is selected without accounting for the inherent lattice parameter mismatch defined between barrier layer 122 and first absorption layer 118. In the exemplary implementation, barrier layer 122 is formed from an alloy such as $Al_{0.93}Ga_{0.07}Sb$. When used in combination with the at least one grading layer 120, barrier layer 122 and grading layer 120 provide a smoothly varying valence band edge between first and second absorption layers 118 and 124. As such, the alloy also provides a conduction-band barrier for majority carrier electrons. In an alternative implementation, more than one barrier layer 122 may be positioned between first and second absorption layers 118 and 124.

In one implementation, barrier layer 122 is fabricated from a p-type semiconductor material. More specifically, the semiconductor material of barrier layer 122 is doped with at least one of silicon or beryllium to facilitate increasing the hole concentration within the alloy.

As described above, at least one grading layer 120 is positioned between first absorption layer 118 and barrier layer 122. In some implementations, any suitable materials for managing the energy band transition between first absorption layer 118 and barrier layer 122 may be used that enables dual-band infrared detector 112 to function as described herein. More specifically, grading layer 120 facilitates the collection of photo-generated minority carriers (i.e., holes) without creating internal energy barriers within dual-band infrared detector 112. In the exemplary implementation, the at least one grading layer 120 includes a first grading layer (not shown) fabricated from an alloy including indium, gallium, and arsenic ($InGa_{(0.15->0)}As$), and a second grading layer (not shown) fabricated from an alloy including indium, arsenic, and antimony ($InAsSb_{(0->0.12)}$).

Alternatively, the grading layer can include a quaternary semiconductor material including indium, gallium, arsenic, and antimony, and having a composition that varies in depth to facilitate a smooth transition of the valence band between first absorption layer 118 and barrier layer 122.

Top contact layer 128 is a highly doped layer, is highly conductive, and has a low electrical resistance relative to second absorption layer 124. Top contact layer 128 may also have any thickness and doping that enables dual-band infrared detector 112 to function as described herein. Moreover, top contact layer 128 may be formed from any material that enables dual-band infrared detector 112 to function as described herein. In the exemplary implementation, top contact layer 128 is formed from an alloy including indium, arsenic, and antimony (InAs0.88Sb0.12).

In some implementations, dual-band infrared detector 112 also includes a substrate 130 and a buffer layer 132 in which subsequent layers of material of dual-band infrared detector 112 are formed thereon. Substrate 130 provides physical support for dual-band infrared detector 112, and may be formed from any material that enables dual-band infrared detector 112 to function as described herein. Exemplary substrate materials include, but are not limited to gallium arsenide (GaAs), gallium antimonide (GaSb), indium arsenide (InAs), and silicon (Si). Moreover, when substrate 130 is formed from GaAs, for example, the lattice parameter mismatch between substrate 130 and other materials used to form dual-band infrared detector 112 is greater than a predetermined threshold. As such, in the exemplary implementation, buffer layer 132 is positioned between substrate 130 and first absorption layer 118 to facilitate reducing the stress in subsequent layers of material formed on substrate 130.

As such, Table 1 illustrates an exemplary structure of dual-band infrared detector 112. However, it should be understood that any number of layers, materials, layer thicknesses, polarity, and doping may be selected that enables dual-band infrared detector 112 to function as described herein.

TABLE 1

| Layer | Material | Nominal Thickness (A) | Polarity | Doping ($cm^{-3}$) |
|---|---|---|---|---|
| Substrate | GaAs | $6.25 \times 10^6$ | Semi-insulating | Undoped |
| Buffer | AlGaInAsSb | 20000 | Undoped | Undoped |
| SWIR Absorber | $InGa_{0.15}As$ | 30000 | n | 1.0E+16 |
| Grading Layer 1 | $InGa_{(0.15 \to 0)}As$ | 1600 | n | 1.0E+16 |
| Grading Layer 2 | $InAsSb_{(0 \to 0.12)}$ | 1500 | n | 1.0E+16 |
| Barrier Layer | $Al_{0.97}Ga_{0.03}Sb$ | 1200 | p | 1.0E+16 |
| MWIR Absorber | $InAs_{0.88}Sb_{0.12}$ | 20000 | n | 1.0E+16 |
| Top Contact | $InAs_{0.88}Sb_{0.12}$ | 1000 | n | 5.0E+17 |

In operation, readout integrated circuit 114 selectively applies a bias voltage to dual-band infrared detector 112 between first and second absorption layers 118 and 124 to enable dual-band infrared detector 112 to detect first and second infrared radiation 106 and 108 (shown in FIG. 1). More specifically, readout integrated circuit 114 is electrically coupled to the infrared sensitive material of dual-band infrared detector 112 via a plurality of indium bumps (not shown) on interface 116. Dual-band infrared detector 112 is patterned into an array of pixels, and each pixel is electrically connected to a unit cell of readout integrated circuit 114 via respective indium bumps. Readout integrated circuit 114 then applies a bias voltage to dual-band infrared detector 112 to activate it.

A first bias voltage generated by readout integrated circuit 114 is a positive bias for first absorption layer 118 and a negative bias for second absorption layer 124, which activates first absorption layer 118 and deactivates second absorption layer 124. With the first bias voltage, dual-band infrared detector 112 is operable to detect first infrared radiation 106 and generate current for collection and processing by readout integrated circuit 114. A second bias voltage having an opposite polarity as the first bias voltage is generated by readout integrated circuit 114, and is a negative bias for second absorption layer 124 and a positive bias for first absorption layer 118, which deactivates first absorption layer 118 and activates second absorption layer 124. With the second bias voltage, dual-band infrared detector 112 is operable to detect second infrared radiation 108 and generate current for collection and processing by readout integrated circuit 114. In one implementation, the first and second bias voltages are applied sequentially. Moreover, readout integrated circuit 114 can include a microchip, including at least a processing device and circuitry, that facilitates providing first and second bias voltages to focal plane array 102.

Dual-band infrared detector 112 may be formed using any process that enables focal plane array 102 to function as described herein. For example, buffer layer 132, first absorption layer 118, grading layer 120, barrier layer 122, second absorption layer 124, and top contact layer 128 are grown on substrate 130 in succession using a molecular beam epitaxy (MBE) process.

Figure 3:
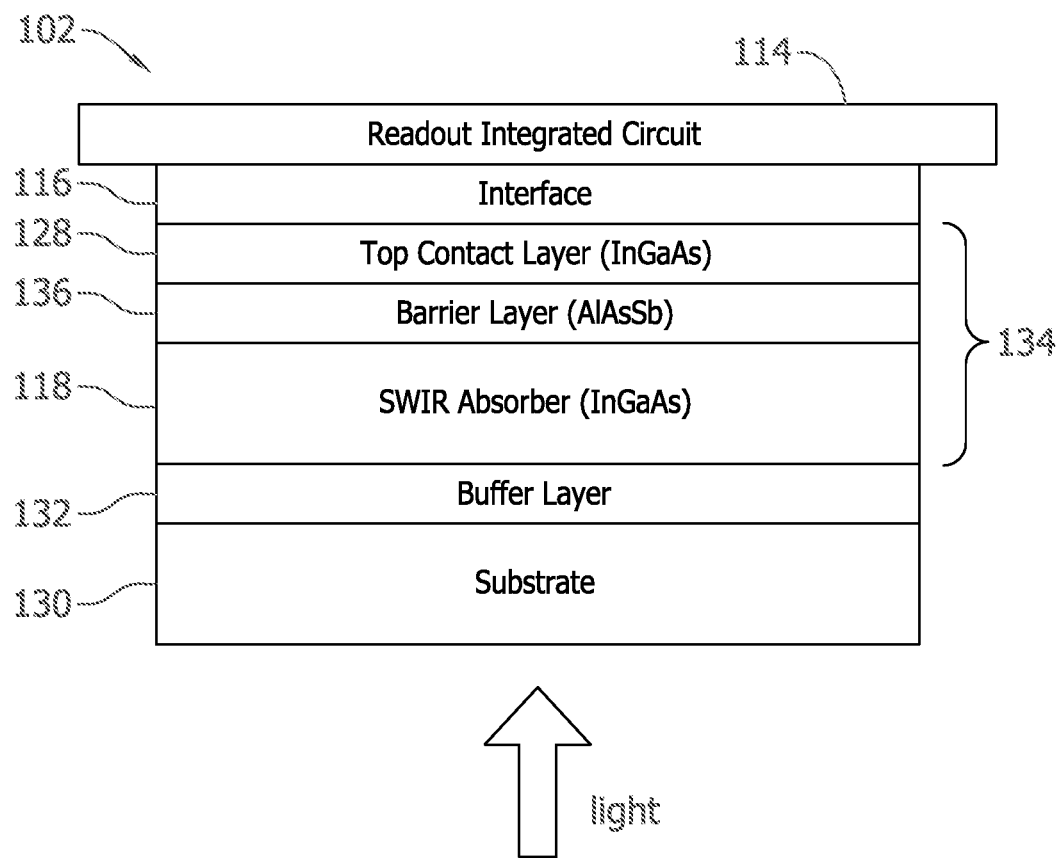
FIG. 3 is a schematic illustration of a single-band infrared detector that may be used with the focal plane array shown in FIG. 1.

FIG. 3 is a schematic illustration of a single-band infrared detector 134 that may be used with focal plane array 102. In the exemplary implementation, single-band infrared detector 134 is electrically coupled to readout integrated circuit 114 via interface 116. Single-band infrared detector 134 includes first absorption layer 118 sensitive to radiation in only a short wavelength infrared spectral band, at least one barrier layer 136 coupled to first absorption layer 118, and top contact layer 128 coupled to barrier layer 136.

Similar to barrier layer 122 (shown in FIG. 2), barrier layer 136 is formed from an alloy that is compatible with first absorption layer 118. More specifically, barrier layer 122 is fabricated from an alloy including aluminum and antimony, and at least one of gallium or arsenic. Typically, such alloys are used in conjunction with MWIR absorbers, and a different alloy is used in conjunction with SWIR absorbers. However, the composition of the alloy used to fabricate barrier layer 136 is selected such that valence bands of barrier layer 136 and first absorption layer 118 substantially align. Put another way, the composition of the alloy used to fabricate barrier layer 136 is selected such that the valence band offsets between barrier layer 136 and first absorption layer 118 are less than a predetermined threshold.

Moreover, the alloy used to fabricate barrier layer 136 is generally lattice mismatched with SWIR absorbers fabricated from indium, gallium, and arsenic. As such, first absorption layer 118 and barrier layer 136 are formed from materials having a lattice parameter mismatch greater than a predetermined threshold. For example, the lattice parameter mismatch between first absorption layer 118 and barrier layer 136 is greater than about 2.5 percent. As such, the composition of barrier layer 136 is selected without accounting for the inherent lattice parameter mismatch defined between barrier layer 136 and first absorption layer 118. In the exemplary implementation, barrier layer 136 is formed from an alloy such as $AlAs_{0.3}Sb_{0.7}$. Barrier layer 136 includes arsenic, as opposed to gallium in barrier layer 122, and naturally aligns with first absorption layer 118 without having to accommodate second absorption layer 124 in dual-band infrared detector 112

Table 2 illustrates an exemplary structure of single-band infrared detector 134. However, it should be understood that any number of layers, materials, layer thicknesses, polarity, and doping may be selected that enables single-band infrared detector 134 to function as described herein.

TABLE 2

| Layer | Material | Nominal Thickness (A) | Polarity | Doping (cm$^{-3}$) |
|---|---|---|---|---|
| Substrate | GaAs | 6.25 × 10$^6$ | Semi-insulating | Undoped |
| Buffer | AlGaInAsSb | 20000 | Undoped | Undoped |
| SWIR Absorber | In$_{0.85}$Ga$_{0.15}$As | 20000 | n | 1.0E+16 |
| Barrier | AlAs$_{0.3}$Sb$_{0.7}$ | 1200 | p | 1.0E+16 |
| Top Contact | In$_{0.85}$Ga$_{0.15}$As | 1000 | n | 2.0E+17 |

In operation, readout integrated circuit 114 selectively applies a bias voltage to single-band infrared detector 134 to enable it to detect first infrared radiation 106 (shown in FIG. 1). More specifically, readout integrated circuit 114 is electrically coupled to the infrared sensitive material of single-band infrared detector 134 via a plurality of indium bumps (not shown) on interface 116. Single-band infrared detector 134 is patterned into an array of pixels, and each pixel is electrically connected to a unit cell of readout integrated circuit 114 via respective indium bumps. Readout integrated circuit 114 then applies a bias voltage to single-band infrared detector 134 to activate it.

Single-band infrared detector 134 may be formed using any process that enables focal plane array 102 to function as described herein. For example, buffer layer 132, first absorption layer 118, barrier layer 122, and top contact layer 128 are grown on substrate 130 in succession using a molecular beam epitaxy (MBE) process.

A method of detecting infrared radiation is also described herein. The method includes applying a bias voltage to a single-band infrared detector including an absorption layer sensitive to radiation in only a short wavelength infrared spectral band, and a barrier layer coupled to the absorption layer. The barrier layer is fabricated from an alloy comprising aluminum and antimony, and at least one of gallium or arsenic, and the composition of the alloy is selected such that valence bands of the absorption layer and the barrier layer substantially align. The method also includes receiving an electrical signal from the single-band infrared detector when the bias voltage is applied thereto, wherein the electrical signal corresponds to detection of radiation in the short wavelength infrared spectral band.

In one implementation, the method also includes selectively applying the bias voltage to the first absorption layer sensitive to wavelengths defined within a range between about 1 micrometer and about 2.5 micrometers.

A method of detecting multiple bands of infrared radiation is also described herein. The method includes selectively applying bias voltages to a dual-band infrared detector including a first absorption layer, a barrier layer coupled to the first absorption layer, and a second absorption layer coupled to the barrier layer. The first absorption layer is sensitive to radiation in only a short wavelength infrared spectral band and the second absorption layer is sensitive to radiation in only a medium wavelength spectral band. The barrier layer is fabricated from an alloy comprising aluminum and antimony, and at least one of gallium or arsenic, and the composition of the alloy is selected such that valence bands of said first absorption layer and said barrier layer substantially align. The method also includes receiving a first electrical signal from the dual-band infrared detector when a bias voltage having a first polarity is applied thereto, and receiving a second electrical signal from the dual-band infrared detector when a bias voltage having a opposite second polarity is applied thereto. The first electrical signal corresponds to detection of radiation in the short wavelength infrared spectral band, and the second electrical signal corresponds to detection of radiation in the medium wavelength infrared spectral band.

In one implementation, selectively applying bias voltages includes applying the bias voltages to the dual-band infrared detector sequentially. Moreover, in some implementations, the method includes selectively applying the bias voltage to the first absorption layer sensitive to wavelengths defined within a range between about 1 micrometer and about 2.5 micrometers, and includes selectively applying the bias voltage to the second absorption layer sensitive to wavelengths within a range between about 3.0 micrometers and about 5 micrometers.

This written description uses examples to disclose various implementations, including the best mode, and also to enable any person skilled in the art to practice the various implementations, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An infrared detector comprising:
   an absorption layer sensitive to radiation in only a short wavelength infrared spectral band ranging between about 1 micrometer and about 2.5 micrometers; and
   a barrier layer coupled to and lattice mismatched from said absorption layer, wherein said barrier layer is fabricated from an alloy comprising aluminum and antimony, and at least one of gallium or arsenic, and the composition of the alloy is selected such that valence bands of said absorption layer and said barrier layer substantially align.

2. The infrared detector in accordance with claim 1, wherein said barrier layer comprises AlAs$_{0.3}$Sb$_{0.7}$.

3. The infrared detector in accordance with claim 1, wherein said absorption layer and said barrier layer are formed from materials having a lattice parameter mismatch greater than a predetermined threshold.

4. The infrared detector in accordance with claim 3, wherein the lattice parameter mismatch is greater than about 2.5 percent.

5. The infrared detector in accordance with claim 1, wherein said absorption layer is fabricated from an alloy comprising indium, gallium, and arsenic.

6. The infrared detector in accordance with claim 1, wherein said barrier layer is fabricated from a p-type semiconductor material.

7. The infrared detector in accordance with claim 6, wherein the p-type semiconductor material of said barrier layer is doped with at least one of silicon or beryllium.

8. The infrared detector in accordance with claim 1 further comprising:
   at least one buffer layer coupled on an opposing side of said absorption layer from said barrier layer; and
   a substrate coupled to said at least one buffer layer.

9. An imaging system comprising:
   a readout integrated circuit; and an infrared detector electrically coupled to said readout integrated circuit, wherein said infrared detector comprises:
an absorption layer sensitive to radiation in only a short wavelength infrared spectral band ranging between about 1 micrometer and about 2.5 micrometers; and
a barrier layer coupled to and lattice mismatched from said absorption layer, wherein said barrier layer is fabricated from an alloy comprising aluminum and antimony, and at least one of gallium or arsenic, and the composition of the alloy is selected such that valence bands of said absorption layer and said barrier layer substantially align,
wherein said readout integrated circuit is configured to apply a bias voltage to said infrared detector.

10. The imaging system in accordance with claim 9, wherein said barrier layer comprises $AlAs_{0.3}Sb_{0.7}$.

11. The imaging system in accordance with claim 9, wherein said absorption layer and said barrier layer are formed from materials having a lattice parameter mismatch greater than a predetermined threshold.

12. The imaging system in accordance with claim 11, wherein the lattice parameter mismatch is greater than about 1.0 percent.

13. The imaging system in accordance with claim 9, wherein said absorption layer is fabricated from an alloy comprising indium, gallium, and arsenic.

14. The imaging system in accordance with claim 9, wherein said barrier layer is fabricated from a p-type semiconductor material.

15. The imaging system in accordance with claim 14, wherein the p-type semiconductor material of said barrier layer is doped with at least one of silicon or beryllium.

16. The imaging system in accordance with claim 9 further comprising:
at least one buffer layer coupled on an opposing side of said absorption layer from said barrier layer; and
a substrate coupled to said at least one buffer layer.

17. A method of detecting infrared radiation, said method comprising:
applying a bias voltage to a single-band infrared detector including an absorption layer sensitive to radiation in only a short wavelength infrared spectral band ranging between about 1 micrometer and about 2.5 micrometers, and a barrier layer coupled to and lattice mismatched from the absorption layer, wherein the barrier layer is fabricated from an alloy comprising aluminum and antimony, and at least one of gallium or arsenic, and the composition of the alloy is selected such that valence bands of the absorption layer and the barrier layer substantially align; and
receiving an electrical signal from the single-band infrared detector when the bias voltage is applied thereto, wherein the electrical signal corresponds to detection of radiation in the short wavelength infrared spectral band.

* * * * *